United States Patent
Strobl et al.

(10) Patent No.: US 10,131,449 B2
(45) Date of Patent: Nov. 20, 2018

(54) ACTUATOR MOUNTING METHOD AND METHOD FOR PRODUCING AN ICE PROTECTION DEVICE AS WELL AS MOUNTING DEVICE

(71) Applicant: Airbus Defence and Space GmbH, Ottobrunn (DE)

(72) Inventors: Tobias Strobl, Munich (DE); Stefan Storm, Unterschleissheim (DE)

(73) Assignee: Airbus Defence and Space GmbH, Ottobrunn (DE)

( * ) Notice: Subject to any disclaimer, the term of this patent is extended or adjusted under 35 U.S.C. 154(b) by 1015 days.

(21) Appl. No.: 14/565,924

(22) Filed: Dec. 10, 2014

(65) Prior Publication Data

US 2015/0183530 A1 Jul. 2, 2015

(30) Foreign Application Priority Data

Dec. 11, 2013 (DE) .................. 10 2013 020 496

(51) Int. Cl.
*B64F 5/10* (2017.01)
*H01L 41/313* (2013.01)
*B64D 15/12* (2006.01)
*B64D 15/16* (2006.01)
*B32B 37/12* (2006.01)
*B32B 37/16* (2006.01)
*B32B 38/00* (2006.01)
(Continued)

(52) U.S. Cl.
CPC ............... *B64F 5/10* (2017.01); *B32B 37/10* (2013.01); *B32B 37/1284* (2013.01); *B32B 37/16* (2013.01); *B32B 38/00* (2013.01); *B64D 15/12* (2013.01); *B64D 15/163* (2013.01); *H01L 41/313* (2013.01); *B32B 2038/0076* (2013.01); *B32B 2307/206* (2013.01); *B32B 2605/18* (2013.01); *Y10T 29/49826* (2015.01); *Y10T 156/10* (2015.01)

(58) Field of Classification Search
USPC ........................................................ 156/249
See application file for complete search history.

(56) References Cited

U.S. PATENT DOCUMENTS 3,341,835 A * 9/1967 Werner .................. B64D 15/20
340/582
3,519,229 A 7/1970 Gullberg
(Continued)

FOREIGN PATENT DOCUMENTS

DE 10 2004 060 675 A1 6/2006
DE 10 2011 078 706 A1 1/2013
(Continued)

OTHER PUBLICATIONS

G. Fortin, M. Adomou, J. Perron, "Experimental Study of Hybrid Anti-Icing Systems Combining Thermoelectric and Hydrophobic Coatings", SAE International, Warrendale, Pa, 2011. (Ten (10) pages).

(Continued)

*Primary Examiner* — Sing P Chan
(74) *Attorney, Agent, or Firm* — Crowell & Moring LLP (57) ABSTRACT

An actuator mounting method for mounting at least one actuator involves providing a skin structure and at least one actuator, and fixing the at least one actuator to the inner surface of the skin structure.

13 Claims, 5 Drawing Sheets

(51) Int. Cl.
*B32B 38/10* (2006.01)
*B32B 37/10* (2006.01)

(56) References Cited

U.S. PATENT DOCUMENTS

| | | | |
|---|---|---|---|
| 5,249,785 A * | 10/1993 | Nelson | B25B 11/005 |
| | | | 269/21 |
| 6,097,135 A | 8/2000 | Cappabianca | |
| 6,702,233 B1 | 3/2004 | DuPont | |
| 6,994,762 B2 | 2/2006 | Clingman et al. | |
| 2007/0176323 A1 | 8/2007 | Jones et al. | |
| 2008/0279659 A1 * | 11/2008 | Kobayashi | H01L 21/67092 |
| | | | 414/222.01 |
| 2009/0079301 A1 | 3/2009 | Grohmann et al. | |
| 2010/0147458 A1 * | 6/2010 | Donnay | F16F 15/324 |
| | | | 156/281 |
| 2010/0206990 A1 | 8/2010 | Petrenko | |
| 2012/0074262 A1 * | 3/2012 | Chuc | B64D 15/163 |
| | | | 244/134 A |
| 2013/0032671 A1 * | 2/2013 | Giles | B64D 15/16 |
| | | | 244/134 R |

FOREIGN PATENT DOCUMENTS

| | | |
|---|---|---|
| DE | 10 2010 045 450 B4 | 4/2013 |
| EP | 0 658 478 A1 | 6/1995 |
| EP | 0 739 656 A2 | 10/1996 |
| EP | 0 855 340 A2 | 7/1998 |
| EP | 1 017 580 B1 | 8/2004 |
| WO | WO 2004/047192 A2 | 6/2004 |
| WO | WO 2007/071231 A1 | 6/2007 |

OTHER PUBLICATIONS

K. Al-Khalil, T. Ferguson, D. Phillips, "A Hybrid Anti-icing Ice Protection System", AIAA 97-0302 (1997), pp. 1-8.

German-language European Search Report dated May 28, 2015, with Statement of Relevancy (Eight (8) pages).

* cited by examiner

ACTUATOR MOUNTING METHOD AND METHOD FOR PRODUCING AN ICE PROTECTION DEVICE AS WELL AS MOUNTING DEVICE

The invention relates to an actuator mounting method for mounting at least one actuator. The invention relates in particular to an actuator mounting method for producing a mechanical ice protection device for an aircraft for avoiding ice formation on a surface area and/or for de-icing the surface area of the aircraft. Moreover, the invention relates to a mounting device to be used in such a method and a production method for producing a hybrid device for de-icing and/or for avoiding ice formation for an aircraft.

The invention pertains to the technical field of mounting actuators. The invention will be explained by way of example with reference to the production and/or mounting of a device for de-icing and/or for avoiding ice formation for an aircraft, but is not limited to this field.

Ice forms in exposed locations of aircraft such as the front edges of wings, tail units, horizontal stabilisers or jet engine inlets, when the aircraft, such as for example an aeroplane, flies through a cloud that contains undercooled water droplets or when drops/humidity impinge onto an undercooled aircraft structure. When an ice layer grows, it impedes the airflow over the surface concerned. If the layer becomes thick enough, for example carrying problems or handling problems in connection with the aircraft can develop.

Ice protection systems for aircraft to avoid such ice formation are already in use. Most ice protection systems are implemented as anti-icing systems for avoiding the formation of ice. As a rule, heating systems integrated into the structure are provided to this end. Whilst flying under icing conditions, wing edges are heated for example with hot branched-off air or bleed air or by means of electric heaters in the wing edges. Moreover, above all in smaller aircraft, pneumatically operated de-icing devices are used, which in regular intervals inflate rubber mats or rubber tubes integrated into the leading edge of the wing, as a result of which the attached ice is detached.

The conventional de-icing measures are associated with a high amount of energy during the flight. The energy consumption needed for freeing the surfaces of the aircraft from ice amounts to approx. 240 to 260 kW of branched-off air power or approx. 130 to 150 kW of electric heating power for a surface to be de-iced of approx. 12 to 15 $m^2$. In the case of branched-off air, this data corresponds to an area performance of approx. 18.5 $kW/m^2$ or approx. 10 $kW/m^2$ of electric heating.

Known systems or devices for removing ice accumulations during flight on aerodynamically efficient surfaces can be generally classified into pneumatic, thermal and mechanical de-icing systems. Thus, a device for pneumatically de-icing surfaces on aircraft is known from EP 0 658 478 B1. A device for de-icing or avoiding ice formation on surface areas of aircraft using warm branched-off air from the jet engine is known from U.S. Pat. No. 6,702,233 B1.

An assembly for de-icing a surface area of an aircraft by means of laser radiation of the surface area is known from DE 10 2010 045 450 B4.

Other devices for de-icing and/or for avoiding ice formation use thermal de-icing by means of electrical heating elements. It is in particular known to avoid icing of the surface of a wing profile on the basis of a large-area heat supply by means of an electrothermal heating mat. An example of such a thermal de-icing system is described in EP 1 017 580 B1.

Further, also devices for de-icing and/or avoiding ice formation are known, which use a number of possibilities as hybrid devices for de-icing, such as in particular the use of thermal energy and mechanical deformation. Examples of known hybrid de-icing systems are known from the following literature sources:

G. Fortin, M. Adomou, J. Perron, "Experimental Study of Hybrid Anti-Icing Systems Combining Thermoelectric and Hydrophobic Coatings", SAE International, Warrendale, Pa., 2011: This document deals with an electrothermal anti-icing system in combination with ice-repellent surface coatings for reducing the energy consumption during de-icing. The supply of heat is carried out in this system over a large area, in order to protect the entire surface afflicted with ice formation. The disadvantage of this system is therefore the fact that in principle a high energy consumption occurs as a result of the permanent operation of the anti-icing system to be installed over a large area in the region of the entire leading edge of a wing.

K. Al-Khalil, T. Ferguson, D. Phillips, "A Hybrid Anti-icing Ice Protection System", AIAA 97-0302 (1997): This document deals with a hybrid de-icing system of the company Cox & Company, Inc., which is composed of a thermal "Running-wet" anti-icing subsystem as well as a subsystem on the basis of electro-expulsive actuators (EMEDS). The thermal subsystem covers the area of drop impingement on the leading edge of the wing in an extensive manner either partially or completely. Thus, the disadvantage of such a thermal subsystem is that a relatively large percentage of the surface of the leading edge area of the wing has to be heated in order to transport the water droplets further downstream, where the drops solidified to form an ice accumulation can then be periodically removed by means of the EMEDS actuators. A further disadvantage of the known hybrid system is moreover the size of the EMEDS actuators.

From WO 2007/071231 A1, for example three-dimensional piezo actuators are known which can generate complex deformation conditions on different base structures. Base structures may for example be large hollow mirrors of telescopes or aerodynamic profiles. In particular, the piezo actuators may be used for investigating flow properties of the aerodynamic profiles.

The invention is based on the object of improving the mounting of actuators.

This object is achieved by an actuator mounting method according to claim 1. An advantageous application of the actuator mounting method during the production of a mechanical device for de-icing and/or for avoiding ice formation and during the production of a hybrid device for de-icing and/or for avoiding ice formation as well as a mounting device for use in the actuator mounting device are the subject matter of the dependent claims.

Advantageous embodiments of the invention are the subject matter of the dependent claims.

The invention provides an actuator mounting method for mounting at least one actuator, comprising the following steps:
a) providing a skin structure,
b) providing at least one actuator that is suitable for deforming the surface area of the skin structure, and
c) fixing the at least one actuator to the inner face of the skin structure.

It is preferred that step c) includes the following:
c1) placing the at least one actuator on a punch for pressing, in a planar manner, the at least one actuator against the inner face of the skin structure.

It is preferred that step c) includes the following:
c2) holding the actuator on the punch by means of releasable holding means.

It is preferred that step c) includes the following:
c3) pressing the actuator against the inner face of the skin structure by means of the punch.

It is preferred that step c) includes the following:
c4) connecting the actuator to the inner face.

It is preferred that step c) includes the following:
c5) releasing and/or removing the punch.

It is preferred that step c4) includes the following:
c4.1) connecting the actuator with the inner face by adhesive bonding.

It is preferred that step c4) includes the following:
c4.2) gluing the actuator to the inner face.

It is preferred that step c4) includes the following:
c4.2.1) applying an adhesive to the inner face and/or a surface of the actuator to be glued onto the inner face prior to attaching the actuator to the inner face.

It is preferred that step c4) includes the following:
c4.2.2) curing the adhesive by pressing the actuator against the inner face.

It is preferred that step c4.2.2) includes the following:
curing the adhesive under application of temperature for generating a mechanical prestress due to the different thermal expansion coefficients of the actuator material and the skin structure.

It is preferred that step c4) includes the following:
c4.3) interposing an electric insulation layer between the actuator and the inner face.

It is preferred that step c2) includes the following:
c2.1) holding the actuator on the punch for example by means of double-sided adhesive tape during the insertion into the skin structure and/or the attachment to the skin structure. Alternatively or in addition, a temporary, releasable connection of the actuator with the punch, for example by way of electrostatic attraction or by sucking the actuator to the punch, can be generated.

It is preferred that step c3) includes the following:
c3.1) moving the punch in a guided manner by a guide unit.

It is preferred that step c3) includes the following:
c3.2) maintaining and/or holding constant an applied pressure by means of a force accumulator, such as for example a Belleville spring.

It is preferred that step c3) includes the following:
c3.3) supporting the outer face of the skin structure by means of a support fixture that is complementary to the outer face.

It is preferred that step a) includes the following:
providing the skin structure with at least one planar inner face on the inside of the skin structure. Alternatively or in addition also an actuator may be used that has the same curvature as the skin structure.

It is preferred that step c) includes the following:
fixing the at least one actuator to the at least one planar inner face.

It is preferred that step b) includes the following:
b.1) providing at least one piezoelectric actuator.

It is preferred that step b) includes the following:
b.2) providing at least one first actuator for deforming a first surface section on a first longitudinal half of the skin structure and providing at least one second actuator for deforming a second surface section on a second longitudinal half of the skin structure.

It is preferred that step c) includes the following:
c5) simultaneously fixing the at least one first actuator to the inner face of the first longitudinal half and the at least one second actuator to the inner face of the second longitudinal half.

According to a further aspect, the invention provides a production method for producing a hybrid de-icing device for an aircraft, for thermally and mechanically de-icing a surface area and/or for thermally and mechanically keeping the surface area free, comprising:
carrying out an actuator mounting method according to any one of the embodiments described above for the purpose of producing and/or mounting the mechanical ice protection unit, and by the following step:
d) attaching a heat output unit for heating at least part of the skin structure.

It is preferred that step d) includes the following:
d1) providing a heat output device (12) that is designed for a linear heat output for the purpose of generating a predetermined breaking point or a predetermined breaking line (32) or a separation line in ice accumulating on the surface area.

It is preferred that step d) includes the following:
d2) attaching the heat output device (12) to the inner face of the skin structure in the region of a leading edge and/or of a stagnation line of an aerodynamic profile body to be formed by the skin structure.

It is preferred that the at least one piezoelectric actuator to be mounted is formed as a $d_{33}$ stack actuator or multilayer actuator.

The actuator is preferably mounted in such a way that the expansion direction of the at least one actuator, in particular of the at least one piezoelectric actuator, is oriented in the direction of the wingspan if used on a profile of a wing. In particular, the expansion direction is oriented with at least one direction component parallel to the surface to be deformed, preferably with a direction component transversely to the approach flow direction such as e.g. the flying direction. In the case of a correspondingly fixed connection between the actuator and the skin structure, a change to the expansion of the actuators will then effect a corresponding clamping of the skin structure, so that a deformation such as e.g. an indentation or bulge can be achieved.

According to a further aspect, the invention provides a mounting device for mounting at least one actuator for deforming and/or moving a surface area of a skin structure for an aircraft—in particular for the purpose of use in a mounting or production method according to any one of the embodiments explained above—comprising:
a punch for a planar pressing of the at least one actuator against an inner face of the skin structure,
a releasable holding means for holding the actuator on the punch, and a press-on unit for pressing the punch with the at least one actuator against the inner face of the skin structure.

A preferred embodiment of the mounting device comprises the following:
an adhesive application unit for applying an adhesive onto the inner face and/or onto a face of the actuator that is to be bonded to the inner face, prior to attaching the actuator to the inner face.

A preferred embodiment of the mounting device comprises the following:

a curing unit for curing the adhesive whilst pressing the actuator on.

It is preferred that the holding means includes a gluing structure for releasably gluing the at least one actuator to the punch. Preferably, a double-sided adhesive tape is used. Alternatively, the holding means can be formed to generate a temporary, releasable connection between the actuator and the punch, preferably by way of electrostatic attraction or by sucking the actuator to the punch.

It is preferred that the press-on unit includes a guiding unit for moving the punch and/or a force accumulator in a guided manner in order to maintain and/or keep constant an applied pressure.

A preferred embodiment of the mounting device comprises:
a support fixture for supporting the outer face of the skin structure whilst pressing the punch on.

Areas of use of the methods and devices according to the invention preferably relate to the mounting and production of devices for de-icing and/or avoiding ice formation. In particular, the invention relates to the mounting of actuators for deforming or moving surface areas, in order to remove in this way ice by means of mechanical energy or to avoid the formation of ice.

According to a further aspect, the invention provides a production method for producing a mechanical ice protection unit for an aircraft for de-icing a surface area of the aircraft by way of carrying out an actuator mounting method of the actuator mounting method described above, wherein the skin structure includes the surface area that is to be kept free from ice on the outer face thereof and/or that is to be de-iced.

It is preferred that the device to be produced thereby is formed as a hybrid device for de-icing and/or for avoiding ice formation by means of thermal and mechanical energy.

Preferably, a device for de-icing and/or for avoiding ice formation for an aircraft can be provided, having a heat output device for outputting heat to a surface area of the aircraft, wherein the heat output device is formed for a linear heat output for the purpose of generating a predetermined breaking point or predetermined breaking line in ice accumulating on the surface area.

A preferred embodiment of the device for de-icing and/or for avoiding ice formation comprises a deformation unit for deforming at least part of the surface of the surface area.

It is preferred that the deformation unit includes at least one piezoelectric actuator or an arrangement of piezoelectric actuators for deforming a surface of the surface area.

Preferably, such actuators are mounted using the mounting method according to the invention on a skin structure of an aerodynamic profile body.

A heat output device, which is preferably to be provided in addition to the mechanical ice protection unit, is formed to output heat in a linear manner, in order to generate in this way a predetermined breaking point or a predetermined breaking line of ice accumulating on the surface area. Thus, the heat output device is formed for outputting heat along a heat output line. Depending on the amount of energy used, a weakening of ice present thereon is formed along the heat output line, so that the ice can be broken up or no ice forms at all along the heat output line, so that ice can only form in sections of the surface area that are separated by the heat output line.

In a particularly preferred embodiment of the device to be mounted using the mounting method and/or the mounting device according to the invention or advantageous embodiments thereof, the deformation means include a first deformation unit on a first section of the surface area and a second deformation unit on a second surface area, that is separated from the first section by the heat output line.

Preferably, the deformation means comprise a first deformation unit on a first side of a heat output line of the heat output device, for deforming a first section located on the first side of the surface area and a second deformation unit on the second side of the heat output line, for deforming a second section of the surface area that is located on the second side.

In a particularly preferred embodiment, the device to be mounted further comprises a surface coating for the surface area, which reduces ice adhesion forces.

It is preferred that the heat output device includes at least one heating wire and/or at least one piezoelectric actuator that is designed and adapted to be capable of a linear output of heat.

According to a further aspect, the invention can be used to produce an aerodynamic profile body for an aircraft, comprising a device for de-icing and/or for avoiding ice formation.

A preferred embodiment of the profile body is preferably characterised in that the heat output device is designed for a linear output of heat for the purpose of generating a predetermined breaking point or a predetermined breaking line along a stagnation line of the profile body and/or along a leading edge of the profile body.

Also in the case of the profile body it is preferred to provide deformation means, by means of which at least part of a surface area of the profile body, that includes the stagnation line and/or the leading edge of the profile body, is deformable so as to remove ice.

Particularly preferably, the deformation means include the first deformation unit for deforming the first section and the second deformation unit for deforming the second section of the surface area, wherein the sections are preferably separated from each other by the stagnation line and/or by the leading edge of the profile body.

It is preferred that a surface area, which includes the stagnation line and/or the leading edge of the profile body, is provided with a surface coating that reduces ice adhesion forces.

It is preferred that the surface section is provided with a nanostructured surface and/or a hydrophobic surface, in particular a superhydrophobic surface.

According to a further aspect, an aircraft having a device according to the invention or an advantageous embodiment thereof or an aerodynamic profile body according to the further aspect of the invention or advantageous embodiments thereof is provided.

According to a further aspect, the devices to be produced by the invention can be used to provide a method for de-icing a surface area of an aircraft and/or for avoiding ice formation on the surface area of the aircraft by introducing mechanical energy on a skin structure.

Preferably, the de-icing method is carried out in addition to introducing thermal energy to the surface area. Particularly preferred is the step of introducing heat along a line on the surface area, in order to form a predetermined breaking point or separation line in ice accumulating on the surface area or water drops accumulating there.

A preferred embodiment of the de-icing method further comprises the following step:
deforming the surface area—in particular by means of piezo actuators—in order to break up ice along the predetermined breaking line and/or in order to remove ice broken up along the predetermined breaking line and/or to remove accumulating water drops.

A further preferred embodiment of the de-icing method comprises the following further step:

providing the surface area with a surface coating reducing ice adhesion forces and/or with a surface characteristic that reduces ice adhesion forces.

In a preferred embodiment of a device for de-icing and/or for avoiding ice formation, heat is output along a heat output line on a surface area that is to be de-iced or to be kept free from ice. Preferably, heat is output along a stagnation line or stagnation point line. As a result, a predetermined breaking line or a separation line between still accumulating water drops or ice accumulations can be provided with a relatively low energy input. This makes the removal of any ice starting to accumulate beyond the heat output line simpler.

Particularly preferably, this device is formed as a hybrid de-icing system. The device formed as a hybrid de-icing system allows a particularly energy-efficient de-icing of ice accumulating during flight.

The present invention in particular relates to an advantageous way of mounting actuators of an electromechanical subsystem of such a hybrid de-icing system. In a preferred embodiment of the invention for de-icing and/or for avoiding ice formation, hybridisation is achieved by:

a) a targeted use of thermal energy—in particular by means of a heating wire, coupled with
b) a deformation of the surface to be de-iced—preferably by one or more piezoelectric actuators—particularly preferably further in combination with
c) a surface coating for reducing ice adhesion forces—for example by means of a nanostructured, superhydrophobic surface such as for example by means of Hydrobead.

In a particularly preferred embodiment, the device for de-icing and/or for avoiding ice formation is formed by a hybrid system that is formed by a combination of three subsystems composed of an electrothermal system, a mechanical system as well as a surface coating. A combination of all three measures has proven to be particularly energy-efficient and to be the most effective solution.

Particularly preferred for deforming the surface area for the purpose of mechanically removing accumulating ice is the provision of piezo actuators.

Of particular interest is a combination of a heat output device linearly outputting heat—such as in particular by means of a heating wire—with a corresponding surface deformation—such as in particular by way of piezo actuators. Such a combination makes it possible for the ice mechanically released from the surface not to be pressed against the surface again by aerodynamic forces of the flow, but is completely removed in particular by way of a punctiform predetermined breaking point (in a two-dimensional view) thermally introduced on the stagnation point or by way of the linear predetermined breaking point thermally introduced along the stagnation line in the direction of the wingspan (in a three-dimensional view).

Further advantages of the thus realisable device for de-icing and/or for avoiding ice formation—in particular in an embodiment as a hybrid system—are a reduced installation space as well as a reduction of the weight of the device.

In particular in the case of integrating the device structurally in a profile body, such as for example a wing profile of an aircraft, there are no moving parts, as a result of which a long service life can be expected.

Further preferred is the use of a heating wire. This also has advantages in respect of sensors. A present heating wire can also be used as a temperature sensor.

Further, the formation of ice on the surface of the profile body, such as for example a wing profile, can also be detected by means of piezoelectric actuators present for deforming the surface, e.g. by a shift of the resonance frequencies or as a result of modified vibration modes.

In this respect, the heating elements and actuators used can also serve as sensors. Thus, additional sensors may be dispensed with; and further weight reductions can be achieved.

The invention and/or advantageous embodiments thereof especially relate to a mounting process of an electromechanical de-icing system or an ice protection system on the basis of piezo actuators.

In a preferred embodiment, a mounting process for mounting piezoelectric multilayer actuators to the inner face of a wing profile is proposed for example for an electromechanical de-icing system.

Preferably, in each case at least one first piezo actuator is glued to the inner face of the wing profile that is difficult to access in the area of the top side—more generally of a first longitudinal half—and at least one second piezo actuator in the area of the bottom side—more generally of a second longitudinal half.

On the basis of the described invention or the advantageous embodiments thereof, the adhesive agent used—e.g. glue—can be applied to a defined layer thickness.

What can further be achieved is a high reproducibility and accuracy with a simultaneous placement of the first and second actuators in just one process step.

The mounting process of actuators, in particular piezo actuators, as described here is preferably used during the production of an electromechanical subsystem of a hybrid ice protection system that uses thermal and electromechanical energy for avoiding ice formation and/or for de-icing.

Embodiment examples of the invention will be explained in more detail below by means of the attached drawings, wherein.

Embodiment examples of an actuator mounting method as well as a production method that can be carried out using this actuator mounting method for producing a device 10 for de-icing and/or for avoiding ice formation will be explained in more detail below.

The actuator mounting method is not limited to the use in devices for de-icing and/or for avoiding ice formation, but can generally be used for mounting an actuator in a skin-shaped body.

To this end, initially embodiment examples of a device 10 that can be obtained using this method for de-icing and/or for avoiding ice formation on a surface area 14 of an aircraft 16 as well as the function thereof will be explained in more detail with reference to FIGS. 1 to 4, after that the individual steps of the mounting process will be addressed in more detail with reference to the remaining figures.

Figure 1:
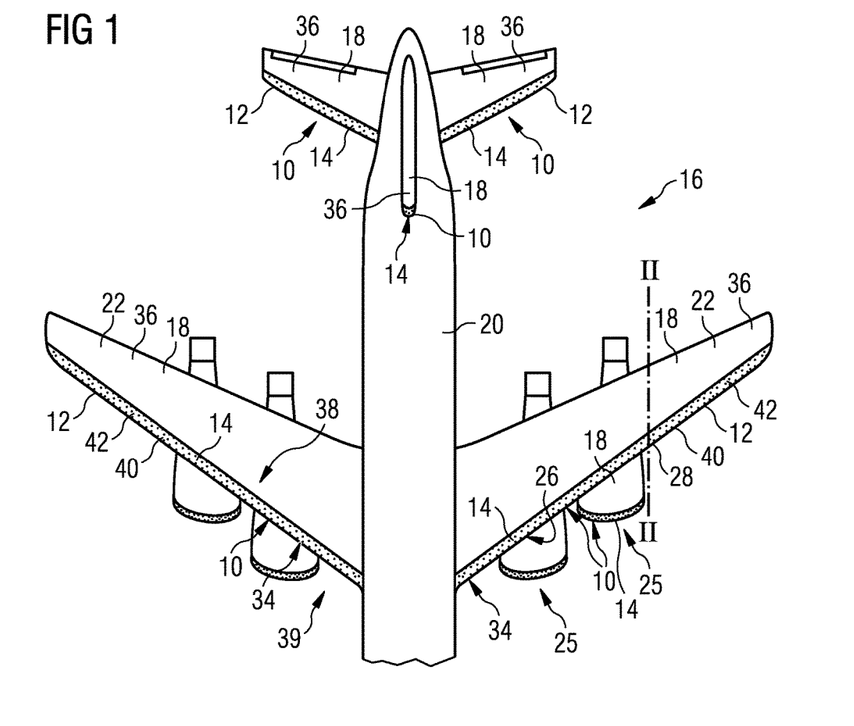
FIG. 1 shows a schematic, partially cut-away view of an aircraft, using an aeroplane as an example, wherein the leading edges of aerodynamic profile bodies of the aircraft, such as in particular wings, fins of the tail unit and engine inlets, are provided with a device for de-icing and/or for avoiding ice formation.
Figure 2:
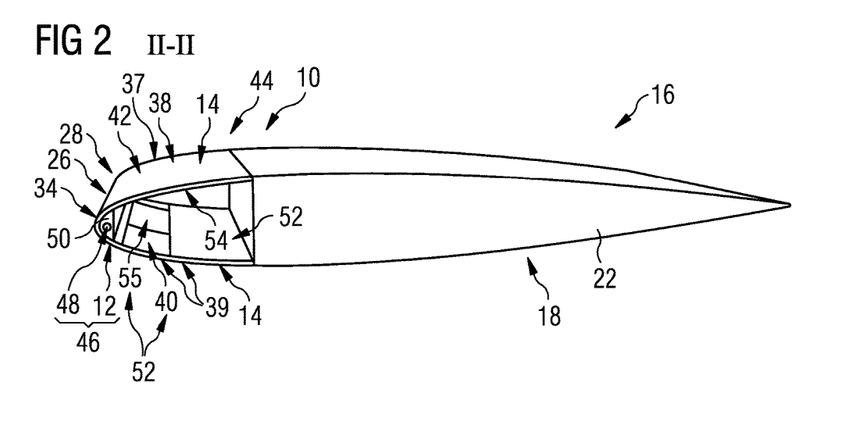
FIG. 2 shows a schematic, partially perspective, partially sectioned view through an aerodynamic profile body, for example for forming a wing of the aircraft of FIG. 1, shown in a section along line II-II of FIG. 1, wherein the profile body is provided with the device for de-icing and/or for avoiding ice formation.

The views in FIGS. 1 and 2 merely represent embodiment examples. Many other deviating embodiments of the device 10 are possible.

FIG. 1 shows an aircraft 16 in the form of an aeroplane 20. The aeroplane 20 has wings 22 which are each formed by profile bodies 18, tail unit fins 24 and engine inlets 25. In the area around the leading edges 26 of the profile bodies 18 of the wings 22 as well as the tail unit fins 24 and the engine inlets 25, there is the surface area 14 on which ice can accumulate during flight.

In order to counteract this, the aircraft 16 comprises a device 10 for de-icing and/or for avoiding ice formation on the surface area 14. The device 10 has a heat output device 12 for outputting heat to the surface area 14.

The heat output device 12 is preferably not formed for an extensive heat output, but for a linear heat output along a heat output line 28. As a result of the linear output along the heat output line 28, any ice 30 accumulating on the surface area 14 can be linearly weakened and can be separated along the heat output line 28. In this respect, the heat output device 12 is formed for forming a predetermined breaking point or a predetermined breaking line 32 for the ice 30.

In a preferred embodiment, the heat output device 12 is formed in such a way that the heat is output in a linear manner along the outermost leading edge 26 and in particular along the stagnation line 34 of the respective aerodynamic profile 36 of the respective profile body 18. The stagnation line 34 is the line that connects the stagnation points of the aerodynamic profile 36 with each other or, in other words, that line on an aerodynamic profile 36 along which, in the case of a corresponding approach air flow, shown in FIGS. 3 and 4 by the arrow and the speed vector v, is divided into streams either to either side or upwards and downwards. During flight, the highest pressure builds up along the stagnation line 34.

In a further preferred embodiment, the heat output device 12 is formed in such a way that the heat is output along the momentary stagnation line 34 of the respective aerodynamic profile 36 of the respective profile body 18. This can be realised for example by means of a number of heating wires linearly attached in the area of the leading edge of the wing. Thus, it can be ensured even under flight conditions at different angles of attack of the wing surfaces or the wing profile that the ice is split up by the linear heat input on or near the respective stagnation line.

The device 10 further has ice protection units 37 for removing ice and/or for avoiding ice accumulations in or on the sections 38, 39 of the surface area 14, which are divided by the heat output line 28 or the stagnation line 34.

In the embodiment shown, a deformation unit 40 for deforming corresponding parts or sections 38, 39 of the surface area 14 is provided as an example of an ice protection unit 37.

Further measures may be provided. For example, in the embodiment shown, a surface coating 42 for reducing ice adhesion forces is additionally provided on the surface area 14.

According to a preferred embodiment, the device 10 is formed as a hybrid de-icing system 44 that carries out ice removal or the avoidance of ice formation on the basis of at least two principles.

The heat output device 12 is preferably formed by an electrothermal system 46 that is formed as a subsystem of the hybrid de-icing system 44.

In a preferred embodiment, the heat output device 12 has a heating wire 48 for the defined formation of a predetermined breaking point on the stagnation line 34 of the profile 36.

To this end, in order to design the device 10 in the area of the leading edge 26 of the profile body 18, which is used for example for forming the wing 22 or for forming tail unit fins 24 or for forming an engine inlet 25, the electrothermal heating wire 48 is installed along the stagnation line 34 of the profile 36, as can be seen in particular from FIG. 2. In a preferred embodiment, the heating wire 48 is embedded in a matrix of fastening material such as in particular an epoxy resin matrix 50.

Instead of using an embedding matrix, the heating wire 48 can also be fixed to the inner face of the profile 36 by means of a thin film adhesive. As a preferred heating wire 48, a single-wire jacket heating conductor with a slim, circular cross section is used. Alternatively, however, also a carbon fibre cord can be used as a heating element. For example, this is impregnated with epoxy resin and/or has glass layers wrapped around it for electrical insulation.

Instead of the heating wire 48, however, the heat output device 12 may also use a piezo actuator that is controlled for example with a high frequency and thus outputs both thermal and mechanical energy. Such a piezo actuator of the further embodiment, which is not shown here in any more detail, without the heating wire 48 should be designed such that it outputs the heat along the heat output line 28 in such a way that a predetermined breaking point is formed.

The device 10 shown here has, apart from the heat output device 12, also an electromechanical de-icing system 52 as a further subsystem of the hybrid de-icing system 44. The electromechanical de-icing system 52 can be regarded as an example of the deformation unit 40. Preferably, the electromechanical de-icing system 52 has at least one piezo actuator 54.

Particularly preferably, the deformation means 40 and the electromechanical de-icing system 52 thereof have a first deformation unit 56 and a second deformation unit 57. The first deformation unit 56 is used for deforming a first section 38 of the surface area 14 on a first side of the heat output line 28. In the example shown in FIG. 2, where the profile body 18 is part of the wing 22, the first section 38 is for example the section located above the stagnation line 34 of the surface area 14 enclosing the leading edge 26. Correspondingly, the second section 39 that is to be deformed by the second deformation unit 57 is, in the example shown, the section of the leading edge surface area 14 that is below the stagnation line 34.

Correspondingly, the electromechanical de-icing system 52 preferably has at least two piezo actuators 54, 55, namely at least one first piezo actuator 54 for the first deformation unit 56 and at least one second piezo actuator 55 for the second deformation unit 57. The first and the second sections 38, 39 may in particular be formed by a first and second longitudinal halves of the profile body 18.

Correspondingly, for example for designing an electro-mechanical de-icing system 52, the installation of at least two piezo actuators 54, 55 in the area of a leading edge 26 of an aerodynamic profile 36 is provided, such as for example the profile body 18 of a wing 22. The piezo actuators 54, 55 are located, in the flow direction, behind the linear heat output area—heat output line 28—defined by the heating wire 48. They are thus used for removing ice accumulations behind the stagnation point of the profile 36 and for removing ice deposits on back-flowing and solidifying drops by means of the electro-thermal system 46.

As piezo actuators 54, 55 in particular $d_{33}$ actuators having for example a length of approx. 30 mm, a width of approx. 10 mm and a height of approx. 2 mm may be used. For more details in respect of the design of the piezo actuators, reference is expressly made to WO 2007/071231 A1.

In order to allow a mechanical coupling into the structure that is as efficient as possible, planar surfaces 82 to be applied to the inner face 76 of the profile 36 (e.g. the wing profile 74) are to be provided for the preferred cuboid piezo actuators 54, 55. The preferred cuboid piezo actuators are in particular advantageous because they can be obtained as low-cost standard components. Alternatively, also form-adapted piezo actuators may be used that have the same curved contour as the profile 36, in order to provide for a mechanical coupling into the structure that is as efficient as possible.

In the preferred embodiment, the device 10 for de-icing and/or for avoiding ice formation preferably also has means for reducing ice adhesion to the surface area 14 as a hybrid de-icing system 44. These means can be regarded as a further subsystem for de-icing. In particular, these means include a surface coating 42.

In a preferred embodiment, the surface area 14 is coated around the leading edge 26 of the aerodynamic profile 36 or, for example, an entire surface area of the profile body 18, for example the wing 22, is coated in such a way that the surface has minimal adhesion characteristics between ice (or water) and the profile surface. For example, a NACA-0012 aluminium wing profile having a nanostructured, superhydrophobic surface area 42 in the area of the leading edge 26 (e.g. Hydrobead) is provided as a profile body 18.

Accordingly, FIG. 2 shows the preferred embodiment of the device 10 with the heat output device 12 provided with the heating wire 48 along the stagnation line 34 as the electro-thermal system 46, having the first and second deformation units 56, 57 formed with piezo actuators 54, 55 for deforming a first section and a second section 38, 39 of the surface area 14 formed the deformation unit 40 as an electromechanical de-icing system 52 and having the surface coating 42 as a further subsystem of the hybrid de-icing system 44.

An operating mode of such a hybrid de-icing system 44 will be explained in more detail below with reference to the views in FIGS. 3 and 4.

Figure 3:
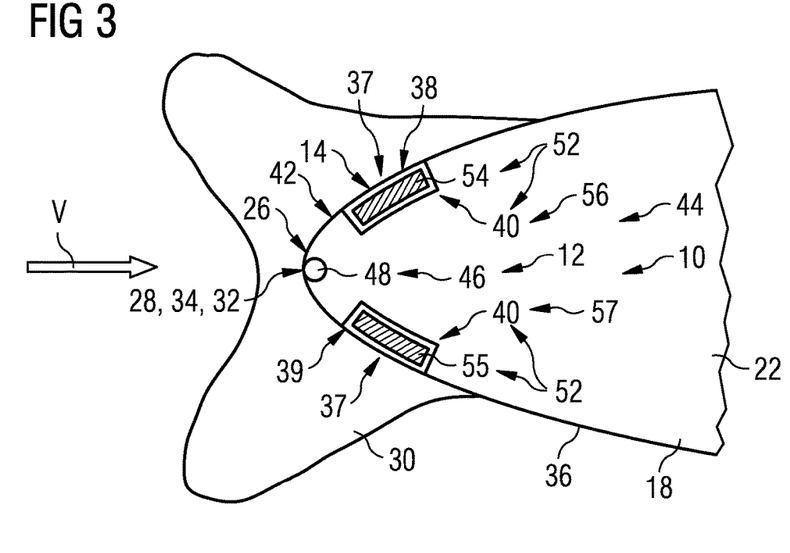
FIG. 3 shows a schematic sectioned view of a section through the leading edge of the profile body of FIG. 2 with the device for de-icing and/or for avoiding ice formation, without the operation of a heat output device.

FIG. 3 shows a schematic diagram of the aerodynamic profile 36 by way of the example of the profile of the wing 22 with a leading edge 26 that is completely covered with ice 30. The indicated heating wire 48 that is glued to the inner face of the profile 36 at the level of the stagnation line 34, for example, has at no time been electrothermally heated. Even if by controlling the indicated piezoelectric actuators 54, 55, a bonding in the interface between the ice and the surface in the surface area 14 of the profile 36 is broken up, the ice layer surrounding the leading edge 26 of the profile 36 will still remain in the same place because the aerodynamic forces of the flow, indicated by the speed vector v, continue to press the ice layer against the leading edge 26 of the profile 36.

Figure 4:
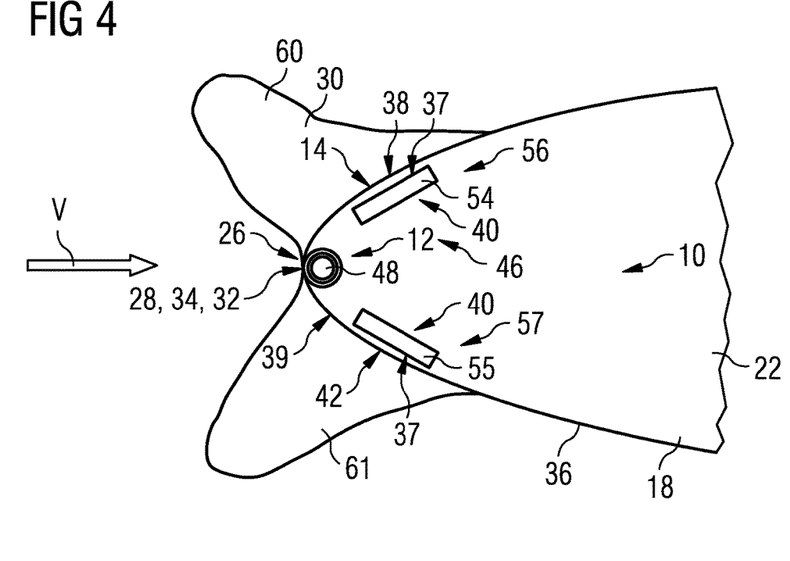
FIG. 4 shows a view as in FIG. 3 during the operation of the heat output device.

By contrast, FIG. 4 shows a schematic diagram of the profile 36 of, for example, the profile body 18 forming the wing 22 with an, e.g. permanently, operated heating wire 48 that is glued onto the inner face of the profile 36 at the level of the stagnation line 34. The introduction of thermal energy, which in a two-dimensional view is punctiform and in a three-dimensional view is linear, generates a predetermined breaking point or a predetermined breaking line 32, which is used for the purpose of partitioning or splitting up the accumulation of ice 30 on the stagnation line 34 of the profile 36 of the wing 22 into an upper proportion 60 and a lower proportion 61 of the ice layer. In more general terms, the ice 30 is split up along the predetermined breaking line 32 into a first portion 60 and a second portion 61. As a result, both ice portions 60, 61 can be removed by the indicated piezo electric actuators 54, 55.

The operating modes of the hybrid de-icing system 44, as depicted in FIGS. 3 and 4, will be explained in even more detail below by way of an example of a possible embodiment of a method for de-icing or for avoiding ice formation on aircraft, which can be carried out for example using the device 10.

As a result of the use for example of a heating wire 48 on the stagnation line 34 of the profile 36 of a wing 22 or the like, which heating wire 48 is glued onto the inner face of the profile 36, thermal energy is linearly transferred onto the profile 36 in the direction of the wingspan. In more general terms, a heat output of a heat output device 12 is carried out linearly in a three-dimensional view or in a punctiform manner in a two-dimensional view, as shown in FIG. 4. This requires the layer of ice 30 surrounding the leading edge 26 to be cut up and can be regarded as an intended introduction of a predetermined breaking point or a predetermined breaking line 32, which is used for partitioning the ice accumulation into a first and a second ice half, for example an upper ice half and a lower ice half.

What is of particular advantage is the joint use of a heating wire 48 for forming the hybrid de-icing system 44 in conjunction with a deformation of a surface area 14 of the profile 36 by means of piezo electric actuators 54, 55.

If one was to go without the heating wire 48, then the piezo actuators 54, 55 would still be able to deform the surface of the profile 36 of the wing 22 and thus to break up the bonding in the interface between the ice and the surface, however, the ice 30 released from the surface would still be pressed onto the profile 36 of the wing 22 by the aerodynamic stagnation pressure of the approach flow. Thus, the surface area 14 is ultimately not freed from ice accumulation, see FIG. 3. As a result of the partitioning into several sections or proportions 60, 61, for example an upper and a lower ice half, by means of the heat output device 12, for example by means of the heating wire 48, a potential problem of pressing the ice 30 against the profile 36 is avoided, see in this respect FIG. 4, and in addition, the effect of the aerodynamic flow against the profile 36 and of the forces acting on the ice 30 as a result, can be utilised.

Thus, the heating wire 48, as opposed to electrothermal systems or heat output devices using heating mats, is not used for an extensive thermal removal of ice accumulations on the aerodynamic profile 36, such as for example of the wing 22, but for a linear breaking up of the ice layer.

Accordingly, a de-icing method that can be carried out for example using the device 10 for de-icing a surface area 14 of an aircraft 16 and/or for avoiding ice formation on the surface area 14 of the aircraft 16, includes the step of introducing heat along a line on the surface area 14, in order to form a predetermined breaking line 32 in ice 30 accumulating on the surface area 14, or a separation line in ice accumulating on the surface area or in water drops accumulating on the surface area.

By skillfully utilising the approach flow, ice can thus possibly be removed by breaking up the ice along a predetermined breaking line.

More preferably heat is introduced along a heat output line 28 for forming a predetermined breaking line 32 or a separation line along a stagnation line 34 of an aerodynamic profile 36.

More preferably the de-icing method further includes at least one of the steps of deforming the surface area 14 in order to break up ice along the predetermined breaking line 32 and/or in order to remove ice broken up along the predetermined breaking line 32 or water accumulations on the sides of the separation line and/or to provide a surface area 14 with surface characteristics that reduce ice adhesion forces, in particular by means of an appropriate surface coating 42.

In a preferred embodiment, the heating wire 48 of the electrothermal system 46 is operated in a permanent running-wet-anti-icing mode. To achieve a low energy consumption, however, the heating wire can alternatively also be operated in a cyclic de-icing mode in order to allow the removal of the separated proportions 60, 61 from ice 30 on the profile 36 by means of the deformation means 40.

The deformation of the surface area 14 is preferably carried out by piezo actuators 54, 55. In particular, the deformation of the surface of the profile 36 is carried out by controlling the piezo actuators 54, 55 in the range of the resonance frequency of the structure, in this case a low control voltage with a contact voltage of 0 V is preferably used, or by a quasi-static excitation of the piezo actuators—here, a high amplitude and a contact voltage of >0 V is preferably used—as a result of which the ice accumulations in the area in the flow direction behind the stagnation line 34 of the profile 36 can be removed.

A further possible control approach lies in a continuous dynamic control of the piezo electric actuators 54, 55 with a square-wave signal having a defined edge steepness at a repeat frequency of for example 1 Hz. The square-wave signal is used to bring the wing structure into resonance and this, in combination with the static excursion, has a further positive effect on the cracking of the ice 30.

If for example two or more piezo actuators 54, 55 are installed on the first and second sections 38, 39 of the profile 36, respectively, for example on the upper side and the lower side of the profile 36 of the wing 22, there is further the possibility of controlling the actuators 54, 55 individually in order to generate any desired form of vibration on the surface of the profile 36, for example a type of wave transversely to the surface of the surface area 14.

The direction of movement of the piezo actuators 54, 55 can be in the direction of the wingspan or in the flying direction ($d_{33}$ effect) or in a planar manner ($d_{31}$ effect).

As a result of the icephobic properties of a superhydrophobic coating 42, the adhesive bonding forces between the ice 30 and the surface of the profile 36 are reduced to a minimum. As a result, an energy-efficient removal of all ice accumulations on the profile 36 is made possible.

In order to provide evidence of functionality, a profile 36 of the wing 22 was caused to ice up under real flight conditions in an icing wind tunnel on a laboratory scale. As a result of the use of all three subsystems of the hybrid de-icing system 44, all of the ice accumulations adhering to the wing profile were removed. In this process, the three subsystems were used as the same time. A comparison of the energy requirements of the hybrid de-icing system 44 with a de-icing system already certified for flight operation, in particular a purely electrothermal de-icing system, showed very clear energy savings.

Further embodiment examples and modifications to the device 10 deal with a reduction of the probability of failure.

Thus, the heat output device 12 could, in order to ensure redundancy of a hybrid de-icing system 44, include a plurality of heating wires 48.

For example, a heating wire 48 could be provided directly on the stagnation line 34 and further heating wires (not shown in more detail) are provided in the area around the stagnation line 34.

Also, in each case a plurality of piezo actuators 54, 55 could be used on the respective sections 38, 39.

Such devices 10 are suitable for carrying out a particularly energy-efficient method for de-icing or for avoiding ice formation. To this end, however, an electromechanical de-icing system 52 is advantageous that allows a deformation of a surface area of the profile body 18 that is as close as possible to the leading edge.

A mounting device 70 and an actuator mounting method for mounting actuators 54, 55 will be explained in more detail below by means of the views shown in FIGS. 5 to 10, which allows such an attachment. Although the mounting device 70 and the actuator mounting method will be explained for the purpose of illustration by means of the embodiment example of a hybrid device 10, applicability is not limited to this. In particular, they can be used in any desired place where the formation of a skin structure 72 that is highly curved or encloses a tight space is to take place by means of actuators.

The actuator mounting method is suitable for mounting at least one actuator 54, 55 and is used in particular for producing a mechanical ice protection unit 37—e.g. the electromechanical de-icing system 52—for an aircraft 16 for avoiding ice formation on the surface area 14 and/or for de-icing the surface area 14 of the aircraft 16. The actuator mounting device comprises in particular the following steps:
a) providing a skin structure 72, on the outer face of which the surface area 14 to be de-iced is to be formed,
b) providing at least one actuator 54, 55 that is suitable for deforming the surface area 14 of the skin structure 72, and
c) fixing the at least one actuator 54, 55 to the inner face of the skin structure 72.

In the example of the device 10 shown in FIG. 2, a basic condition for the mounting of the piezo actuators 54, 55 is the production of a thin skin structure 72 to which the piezo actuators 54, 55 are glued.

Figure 5:
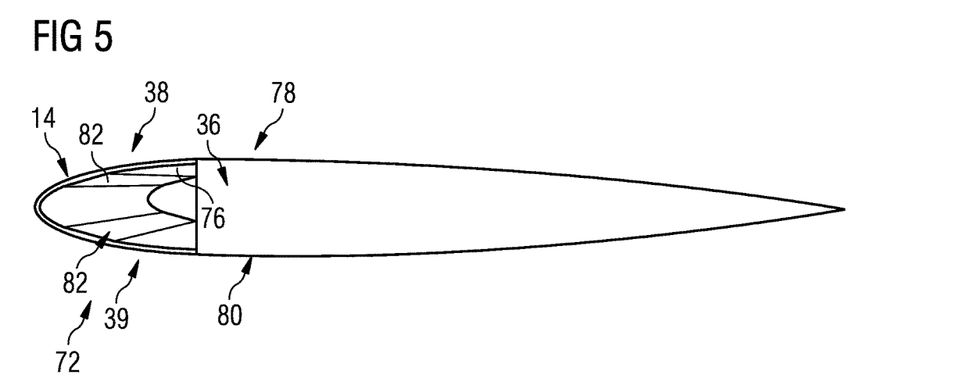
FIG. 5 shows a schematic view of a skin structure for forming the profile body, to which actuators for forming a mechanical ice protection unit of the device are to be mounted.

In this example, a NACA-0012 wing profile is used that was milled from a whole piece. FIG. 5 shows the skin structure 72 of the profile 36 of the profile body 18. This is for example a profile 36 that was milled from a whole piece for a wing 22 in the form of a symmetrical slim NACA 0012 profile. Of course, the mounting method can also be applied to any other profile 36 of the possible profile bodies 18 of the aircraft.

On the inner face 76 of the skin structure 72, a planar surface 82 for the later gluing of the preferably cuboid piezoelectric multilayer actuators is in each case formed in the area of a first longitudinal half 78 and of a second longitudinal half 80.

The surface on the inner face 76 of the profile 36, to which the piezo actuators 54, 55 are later glued, should have a suitable roughness value and should be cleaned prior to further use. Further, a (preferably) planar surface 82 should be provided in this area.

The actuator 54, 55 can alternatively also be glued to a curved skin structure 72. In this case, the skin structure 72 and the actuator 54, 55 preferably have the same curvature.

Subsequently, a mounting device 70 is used for mounting the actuators 54, 55, such as for example shown in a schematic demonstration design in FIG. 6 and indicated in FIGS. 7 to 10.

The mounting device 70 has a punch 86, a press-on unit 88, holding means 90 and a support fixture 92.

The punch 86 is used for receiving and pressing the actuators 54, 55 against the inner face 76 of the skin structure 72.

To this end, the punch 86 includes a reception area 84, the surface shape of which is complementary to that part of the surface structure of the inner face 76 to which the actuators 54, 55 are to be fixed. If for example the planar surfaces 82 are provided, then the reception area 84 is formed with planar surfaces that are inclined at an appropriate angle. To this end, the punch 86 may for example have a generally trapezoidal form. The holding means 90 are formed for temporarily holding the actuators 54, 55 on the punch 86.

The press-on unit 88 is used for pressing the punch 86 against the inner face 76. To this end, in particular a guiding unit 94 and a compression force generation unit 95 for the guided movement of the punch 86 and for pressing on is provided. In order to maintain a constant pressure, in particular a force accumulation element such as e.g. a Belleville spring 97 is provided.

The support fixture 92 is used for supporting the thin skin structure 72 during the pressing-on process. To this end, the surface of the support fixture 92 has a form complementary to that of the surface area 14 of the skin structure 72.

Figure 6:
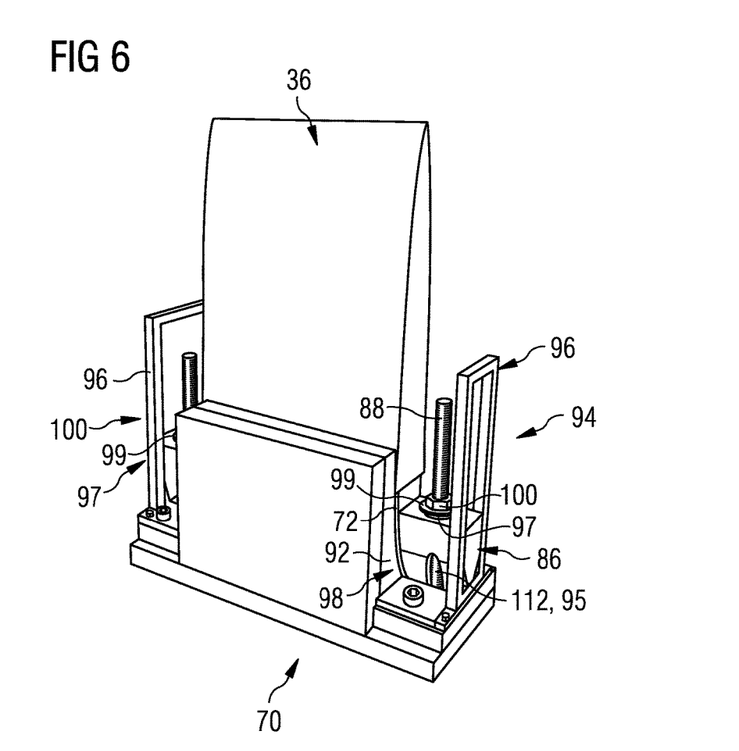
FIG. 6 shows a principal view of a mounting device for mounting actuators to the skin structure of FIG. 5.

FIG. 6 shows a demonstration design of a mounting device 70 for mounting actuators on a small-scale profile 36 for wind tunnel trials. What is shown are the profile 36, lateral guide rails 96 for forming the guide unit 94, the punch 86 with piezo actuators 54, 55 adhering thereto, a polyamide mould 98 as an example of the support fixture 92 as well as nuts 100 for mounting. The compression force generation unit 95 includes threaded bars 112. The nuts 100 can be turned by means of screwdrivers (not shown) towards the inner face 76 by the threaded bars 112, in order to press the punch 86 against the inner face 76. Between the nuts 100 and the punch 86, Belleville springs 97 are provided as force accumulator elements for maintaining a constant pressure. However, also washers 99 may be provided that are positioned between the nut 100 and the Belleville spring 97.

The gluing process will be explained in more detail below by means of the views shown in FIGS. 7 to 10.

If the skin structure 72 and the actuators 54, 55 are provided, then initially the step of applying the actuators 54, 55 to the punch 86 is carried out. An embodiment example of this step of applying or attaching the actuators to the punch 86 will be explained in more detail hereafter.

An adhesive 102 for gluing the actuators to the inner face is applied onto the actuators.

To this end, in a preferred embodiment, for example a thin layer of a film adhesive 104 is cut to size and is applied to that side of the piezo actuator 54, 55 that is later to be connected to the profile 36.

If the inner face of the profile 36 is electrically conductive, an insulation layer 106 from an electrically insulating material is provided between the inner face and the actuators 54, 55.

To this end, if the profile is electrically conductive, for example a prepreg glass fibre fabric 108 for forming the insulation layer 106 is provided for electrical insulation from the carrier structure. The required insulation distance is adjusted via the number of prepreg layers. The higher the electrical control voltage is selected to be, the greater the selected insulation distance will be.

On both sides of the punch 86, which is here provided with a trapezoidal cross section, one piezo actuator 54, 55 each is applied by means of the holding means 90, which for example includes an adhering medium, such as for example a double-sided adhesive tape 110 for a temporary gluing with a view to releasing it again later after the gluing process, or for a physical type of adhesion (e.g. suction via vacuum or electrostatic charging).

If sensitive piezo actuators 54, 55 are used it is advantageous if no transverse point forces are applied to the surface of the piezo actuator 54, 55. As a result, a double-sided adhesive tape 110 has proven to be particularly suitable as a holding means 90.

In this way, the later positioning of the piezo actuators 54, 55 within the profile 36 is determined by the positioning of the piezo actuators 54, 55 on the punch 86. For example, the piezo actuators 54, 55 can be aligned using markings on the punch 86, using stops on the punch or by any other additional orientation means (none of them shown).

After attaching the actuators 54, 55 to the punch 86, the step of material bonding, in particular gluing, of the actuators 54, 55 to the skin structure 72 can take place, which will be explained in more detail hereafter.

For an exact positioning and maintaining the angle from the punch 86 within the profile 36 it is advantageous if the punch 86 is guided, e.g. by means of guide rails 96 or threaded bars 112. The punch 86 can be guided either laterally on both sides, laterally on one side or, in the case of open profiles, also from the rear.

The press-on pressure should be kept constant during the gluing step whilst the adhesive 102 cures. This can be achieved for example by means of force accumulation elements such as e.g. Belleville springs (not shown). The press-on pressure is counteracted with a negative mould—the support fixture 92—of the profile 36 (made e.g. from a polyamide), in order to maintain the shape of the profile 36.

For curing the adhesive 102, a curing device is provided that is formed to carry out the curing step for the respective adhesive 102.

For example, the curing process of the adhesive 102 is carried out in an oven (not shown) at a suitable temperature, preferably below the Curie temperature (120° C.). In order to maintain the temperature, this can be controlled for example using a control bore near the positioning location of the piezo actuator on the punch 86.

By hardening at a suitable temperature, a mechanical prestress can be introduced as required or desired. The mechanical prestress protects the actuator better from tensile stress and/or from defects as may occur in particular in resonance operation.

Optionally, the heating wire 48 may, with the same principle, in addition be glued to the inner face 76 of the profile 36 in the region of the stagnation line 34.

The step of removing the punch 86 after the gluing of the piezo actuators 54, 55 to the profile 36 will be explained in more detail below.

Once the piezo actuators 54, 55 have been glued on, the press-on pressure is released and the punch 86 can be removed. If a double-sided adhesive tape 110 is used, a simplified removal of the punch 86 proves to be particularly suitable in a warm condition, because only a low force will be required for releasing the adhesive tape 110 from the piezo actuators 54, 55.

Figure 7:
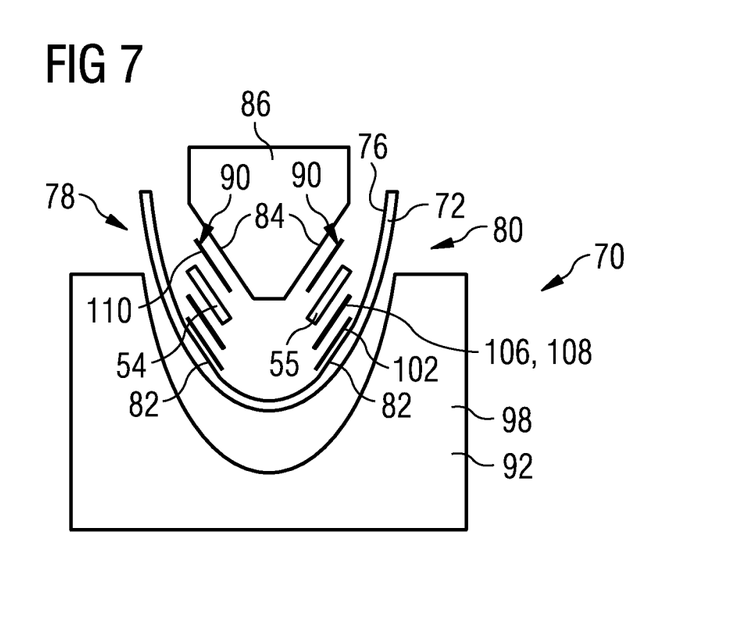
FIGS. 7 to 10 show a schematic view of longitudinal sections through the mounting device with the skin structure for clarifying various steps of a mounting method.

FIG. 7 shows schematically the components used during the application process of the actuators to the skin structure.

Figure 8:
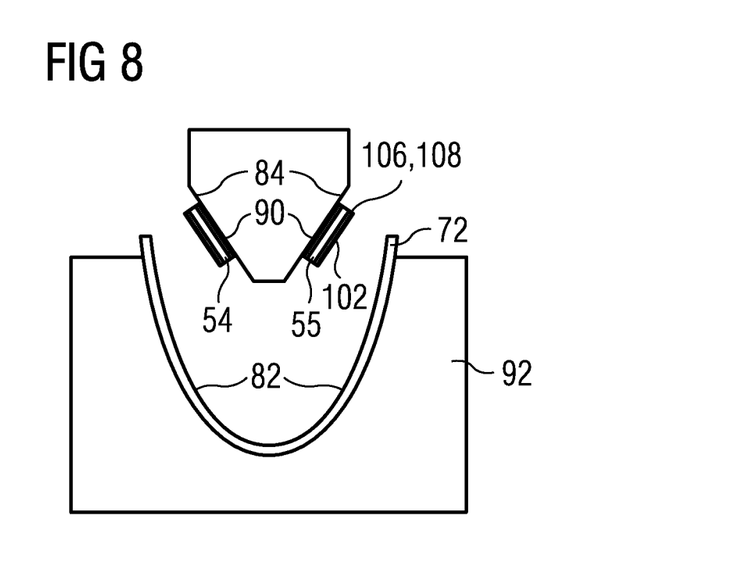

FIG. 8 shows schematically the step of applying the actuators 54, 55 to the punch and the insertion of the punch 86 into the profile 36.

Figure 9:
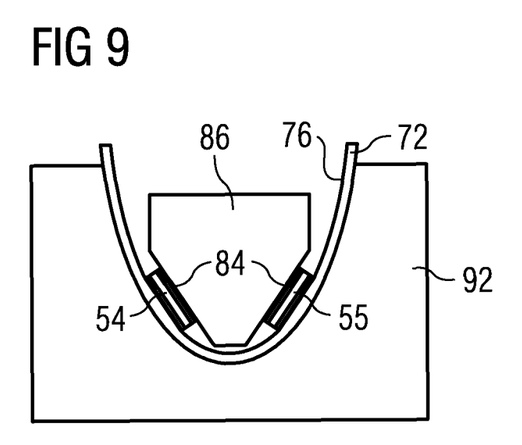

FIG. 9 shows schematically the step of pressing the punch 86 on.

Figure 10:
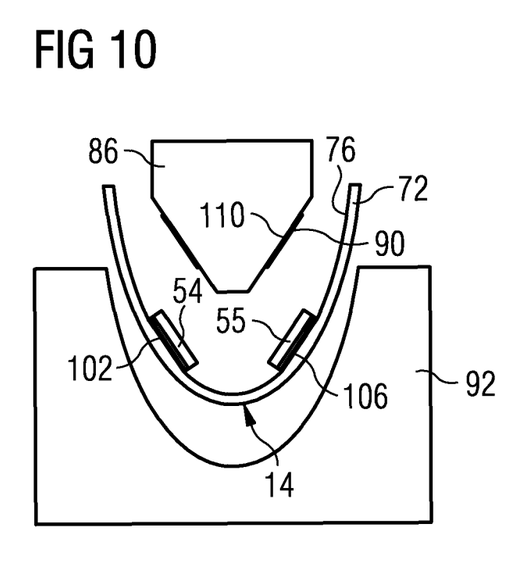

FIG. 10 shows schematically the step of withdrawing the punch 86.

Apart from the possible use of the actuator mounting method shown in the course of the production of ice protection systems, the method can also be used for mounting actuators for other purposes of use. Examples of this are shown in WO 2007/071231 A1, to which reference is expressly made for further details of the further possible purposes of use.

LIST OF REFERENCE NUMERALS

10 Device for de-icing and/or for avoiding ice formation
12 Heat output device
14 Surface area
16 Aircraft
18 Profile body
20 Aeroplane
22 Wing
24 Tail unit fins
25 Engine inlet
26 Leading edge
28 Heat output line
30 Ice
32 Predetermined breaking line (separation line)
34 Stagnation line
36 Profile
37 Ice protection unit
38 First section
39 Second section
40 Deformation unit
42 Surface coating
44 Hybrid de-icing system
46 Electro-thermal system
48 Heating wire
50 Epoxy resin matrix
52 Electromechanical de-icing system
54 First piezo actuator
55 Second piezo actuator
56 First deformation unit
57 Second deformation unit
60 First portion of the ice layer
61 Second portion of the ice layer
70 Mounting device
72 Skin structure
76 Inner face
78 First longitudinal half
80 Second longitudinal half
82 Planar surface
84 Reception area
86 Punch
88 Press-on unit
90 Holding means
92 Support fixture
94 Guide unit
95 Compression force generation unit
96 Lateral guide rail
97 Belleville spring
98 Polyamide mould
99 Washer
100 Nut
102 Adhesive
104 Foil adhesive
106 Insulation layer
108 Prepreg glass fibre fabric
110 Double-sided adhesive tape
112 Threaded bars

The invention claimed is:

1. An actuator mounting method for mounting at least one actuator on or in a skin structure, comprising the following steps:
   a) providing a skin structure;
   b) providing at least one actuator configured to deform a surface area of the skin structure; and
   c) fixing the at least one actuator to an inner face of the skin structure,
   wherein step c) comprises the steps of:
      c1) positioning the at least one actuator on a punch for a planar pressing of the at least one actuator against the inner face of the skin structure;
      c2) holding the actuator on the punch by a releasable holding element;
      c3) pressing the actuator against the inner face of the skin structure by the punch;
      c4) connecting the actuator to the inner face; and
      c5) releasing or removing the punch.

2. The actuator mounting method of claim 1, wherein step c4) comprises the steps of:
   c4.1) materially bonding the actuator to the inner face;
   c4.2) gluing the actuator to the inner face;
   c4.2.1) applying an adhesive to the inner face or a surface of the actuator that is to be glued to the inner face, prior to attaching the actuator to the inner face;
   c4.2.2) curing the adhesive by pressing on the actuator according to step c3); and
   c4.3) interposing an electrical insulation layer between the actuator and the inner face.

3. The actuator mounting method of claim 1, wherein step c2) comprises the steps of:
   c2.1) holding the actuator on the punch using double-sided adhesive tape during the insertion into the skin structure or the attachment to the skin structure.

4. The actuator mounting method of claim 1, wherein step c3) comprises at least one the steps of:
   c3.1) moving the punch in a guided manner by a guide unit;
   c3.2) maintaining or keeping constant an application pressure by a force accumulator; and
   c3.3) supporting an outer face of the skin structure by a support fixture that is complementary to the outer face.

5. The actuator mounting method according of claim 1, wherein step a) includes providing the skin structure with at least one planar surface on the inner face of the skin structure; and step c) includes fixing the at least one actuator to the at least one planar surface.

6. The actuator mounting method of claim 1, wherein step b) includes:

b.1) providing at least one piezoelectric actuator.

7. The actuator mounting method of claim 1, wherein step b) includes b.2) providing at least one first actuator for deforming a section of the surface area that is formed on a first longitudinal half of the skin structure, and providing at least one second actuator for deforming a section of the surface area that is formed on a second longitudinal half of the skin structure, and step c) includes c5) simultaneously fixing the at least one first actuator to the inner face of the first longitudinal half and of the at least one second actuator to the inner face of the second longitudinal half.

8. A production method for producing a mechanical ice protection unit for an aircraft for keeping a surface area of the aircraft free from ice and/or for de-icing the surface area, the production method comprising:

a) providing a skin structure;

b) providing at least one actuator configured to deform a surface area of the skin structure; and c) fixing the at least one actuator to an inner face of the skin structure, d) attaching a heat output device for heating at least part of the skin structure, wherein the skin structure includes on the outer face thereof the surface area to be kept free from ice and to be de-iced.

9. The production method of claim 8, wherein step d) comprises the steps of:

d1) providing a heat output device that is formed for a linear heat output to generate a predetermined breaking point or a predetermined breaking line or a separation line in ice accumulating on the surface area; and d2) attaching the heat output device to the inner face of the skin structure in an area of a leading edge or of a stagnation line of a profile body to be formed by the skin structure.

10. A mounting device comprising:

a punch configure to press, in a planar manner, at least one actuator against an inner face of a skin structure for an aircraft to which the at least one actuator is to be fixedly mounted;

a releasable holder configure to hold the at least one actuator on the punch; and a press-on unit configured to press the punch with the at least one actuator against the inner face of the skin structure.

11. The mounting device of claim 10, further comprising:

an adhesive application unit configured to apply an adhesive to the inner face or a surface to be bonded to the inner face of the at least one actuator prior to the attachment of the actuator to the inner face; and a curing unit configured to cure the adhesive while pressing on the actuator.

12. The mounting device of claim 10, wherein the holder has an adhesion structure for releasably gluing the at least one actuator to the punch.

13. The mounting device of claim 10, wherein a) the press-on unit has a guide unit configured to move the punch in a guided manner or a force accumulation element configured to maintain or keep constant an application pressure, or b) the mounting device has a support fixture configured to support the outer face of the skin structure while pressing the punch.

* * * * *